United States Patent [19]
Brown et al.

[11] Patent Number: 6,086,796
[45] Date of Patent: Jul. 11, 2000

[54] DIAMOND-LIKE CARBON OVER-COATS FOR OPTICAL RECORDING MEDIA DEVICES AND METHOD THEREOF

[75] Inventors: David Ward Brown, Lansdale; Edward George Thear, Macungie; Leonard Joseph Mahoney, Allentown; Rudolph Hugo Petrmichl, Center Valley, all of Pa.

[73] Assignee: Diamonex, Incorporated, Allentown, Pa.

[21] Appl. No.: 08/886,922

[22] Filed: Jul. 2, 1997

[51] Int. Cl.⁷ .................................. B29D 17/00

[52] U.S. Cl. .................. 264/1.33; 264/454; 264/456; 264/461; 264/471; 428/64.4; 428/64.6; 428/457; 428/913; 430/271.1

[58] Field of Search .................. 428/64.1, 64.2, 428/64.4, 64.5, 64.6, 457, 913; 156/150; 264/454, 471, 456, 461, 1.33; 430/273, 945, 495, 271.1

[56] References Cited

U.S. PATENT DOCUMENTS

| | | |
|---|---|---|
| 5,424,106 | 6/1995 | Yamada ................................. 428/64 |
| 5,453,346 | 9/1995 | Kawahara et al. ..................... 430/273 |
| 5,545,454 | 8/1996 | Yamada et al. ....................... 428/64.1 |

*Primary Examiner*—Merrick Dixon
*Attorney, Agent, or Firm*—Coudert Brothers

[57] ABSTRACT

A method is provided for manufacturing a diamond-like carbon (DLC) coated optical phase-change recording medium for use with near-field optical head devices and which exhibits superior wear resistance and improved lifetime. According to the method, the surface of a composite optical phase-change media structure deposited onto a substrate is subjected to ion beam deposition of a DLC overcoat to a thickness of no greater than about 450 Å. Preferably the DLC is ion beam deposited onto the phase-change recording layer at the surface of the medium structure or onto a germanium-containing adhesion-promoting interlayer to achieve the desired adhesion of the DLC to the surface of the medium structure.

33 Claims, 3 Drawing Sheets

DIAMOND-LIKE CARBON OVER-COATS FOR OPTICAL RECORDING MEDIA DEVICES AND METHOD THEREOF

FIELD OF THE INVENTION

This invention relates to optical information recording media and methods for forming an adherent, protective, wear-resistant over-coat on an optical recording surface to tribologically and environmentally protect the media during handling and operation. The invention is particularly applicable to optical recording media having near-field optical head devices used in optical read/write apparatus and related methods.

BACKGROUND OF THE INVENTION

The principle of using laser optics to induce a phase-change phenomenon in a chalcogenide thin film has been well established. By irradiating the film with the appropriate laser condition, the film can be reversibly converted between crystalline and amorphous phases. Such films are referred to as phase-change materials or films. Various laser beam optical systems have been devised to write or erase information by altering the phase of the film and to read digitized information by means of different optical properties (extinction or scattering) between the amorphous and crystalline phases of the film. Both far-field and near-field laser beam optical systems and techniques have been developed. Many workers have optimized the cyclability, stability and optical performance of such films and layered them within an optical media stack on a disk substrate to form structures for either reflective or transmissive optical writing and reading. Such information storage products are commonly referred to as phase-change optical storage media. The method of using a laser beam system to record information on phase-change optical storage media (e.g. disks and tapes) has been commonly referred to as phase-change optical recording.

Most of the phase-change optical media developed for use in the prior art were designed for far-field optical devices wherein the active phase-change film is imbedded in a relatively thick optical stack (on the order of a few $\mu$m) on a base substrate for either reflective or transmissive read/write optical methods. Such optical media structures often include: (1) a base substrate, (2) a dielectric layer with low thermal conductivity and high index of refraction, (3) the phase-change film layer, (4) a second dielectric layer with low thermal conductivity and high index of refraction, (5) one or more reflective layers, and (6) a protective polymer resin over-coat. Optical media structures exemplary of the prior art are disclosed in Akahira, et al., U.S. Pat. No. 5,527,661; Oakda, et al., U.S. Pat. No. 5,521,901; Kawahara, et al., U.S. Pat. No. 5,453,346; Yamada, et al., U.S. Pat. No. 5,424,106; and Yamada, et al., 5,545,454.

In the prior art, the phase-change recording layer is typically disposed between the two dielectric layers. The dielectric layers provide heat resistance to protect thermally sensitive materials, such as polycarbonate substrates and resin over-coats, prevent deformation or evaporation of the phase-change film, transmit the laser beam energy efficiently to the active phase-change layer and provide proven mechanical stability through thermal cycling of the phase-change media. Because of its low thermal conductivity, high index of refraction, and non-reactivity with phase-change materials, $ZnS$—$SiO_2$ is often used as the preferred dielectric and is often applied by sputter deposition techniques. Yamada, et al., U.S. Pat. No. 5,545,454, suggested that several other dielectric compounds may also be used including $SiO_2$, $ZrO_2$, $TiO_2$, $Ta_2O_5$, BN, $Si_3N_4$, AlN, TiN, ZnS, PbS, SiC, diamond and diamond-like carbon. These prior art media structures are intended for application within far-field optical devices. Realizable phase-change recording systems with far-field optics devices have just recently reached areal densities of 300 Mbits/$cm^2$ and, with the proposed use of blue-laser technology, are expected to approach 1 gigabit per square centimeter (Gbit/$cm^2$) densities. (See N. Yamada, *Erasable Phase-Change Optical Materials*, MRS Bulletin, Vol. (9), September 1996, pages 48–50.)

Much higher areal densities are possible with near-field optical devices. Betzig, et al. (Applied Physics Letters, Vol. 61(2), Jul. 13, 1992, pages 142–143) demonstrated that a near-field optical probe positioned at 100 Å above the surface of a magneto-optic recording film could produce ~600 Å bit sizes and resolve images of ~300–500 Å in size. Their work suggests that near-field optics are capable of writing/reading information on optically active media, including phase-change optical media, so as to obtain areal densities as high as ~16 Gbits/$cm^2$ (or ~100 Gbits/$in^2$). The areal density of bit information that can be achieved by near-field optics is determined by the smallest reproducible bit size of $d_s$, the size of the probe beam $d_p$ from the near-field optical device, and the optical distance between the probe and phase-change optical recording layer h. It is desirable to have h about less than about $d_p/2$ in order to produce a domain size $d_s$ about the size $d_p$. For example, if it is desirable to obtain a 500 Å bit size (for a practical areal density of ~16 Gbits/$cm^2$) by means of a near-field laser beam with $d_p \approx 500$ Å, then it is necessary to have h≈250 Å or less.

Near-field optical devices have been developed wherein a semiconductor laser is coupled closely to the surface of a phase-change optical storage medium. Exemplary of the prior art disclosing near-field optical devices used for phase-change media are Ukita, et al., U.S. Pat. No. 4,860,276 and Hopkins, et al., U.S. Pat. No. 5,625,617. In such near-field optical devices, a sub-wavelength semiconductor laser or laser array may be integrated into a "slider" mechanism, typically of aerodynamic design, which allows the laser system to be held over and close to the surface of the spinning medium. The slider containing the optical head may be referred to as an "optical-head-slider." In order to realize commercially viable areal densities (i.e. substantially greater than 2 Gbits/$cm^2$) with such near-field optic devices, the value of h should be no more than 1250 Å. It is preferable that this distance be near or less than 100 Å to obtain the highest possible areal densities.

Sliders with magnetic recording heads (i.e. a magnetic-head-slider) and related air bearing mechanism and methods are widely known and used in magnetic memory recording systems. It is also well known that components used in magnetic recording media systems (e.g. magnetic transducers, magnetic-head-sliders and thin film alloy disks) are susceptible to wear and corrosion to damage as the air bearing surface of the slider contacts the memory storage disk during start-up and shut down of the disk rotation and during operation. Protective diamond-like carbon over-coats are often applied to components to protect them from corrosion and wear, to allow good wetting and reflow of topical lubricants, and to improve the life time of the data storage recording system and media. It would be desirable if similar protective diamond-like carbon over-coat technology were available for phase-change optical recording media to enable the use of near-field optic systems at low flight heights between the optical-head-slider and the media surface.

Amorphous diamond-like carbon (DLC) films are so-named because their properties resemble, but do not duplicate, those of diamond. Some of these properties are high hardness (about 3 to about 22 GPa), low friction coefficient (approximately 0.1) and transparency across the majority of the electromagnetic spectrum. At least some of the carbon atoms in DLC are bonded in chemical structures similar to that of diamond, but without long range crystal order. Although the term DLC was initially intended to define a pure carbon material, the term DLC now includes amorphous, hard carbon materials containing up to 50 atomic percent of hydrogen. Other names for these hydrogen-containing DLC materials are "amorphous hydrogenated carbon", hydrogenated diamond-like carbon, or diamond-like hydrocarbon. The structure of these hydrogen-containing hard carbon materials may be best described as a random covalent network of graphitic-type structures interconnected by $sp^3$ linkages, although the definitive structure of the films has yet to be universally accepted. In addition to the use of carbon and hydrogen, DLC may be doped with other elements or combination of elements. The addition of such elements, e.g. silicon and germanium, can provide or enhance useful material properties such as wear resistance, adhesion, hardness, stress, and oxidation resistance. The term "DLC" is used in the discussion of the present invention to refer to both the amorphous non-hydrogenated hard carbon materials, amorphous hydrogenated hard carbon materials and doped modifications of these two materials.

Many methods for directly depositing DLC films are known in the prior art, including (i) direct ion beam deposition, dual ion beam deposition, glow discharge, radio frequency (RF) plasma, direct current (DC) plasma or microwave plasma deposition from a carbon-containing gas or vapor which can also be mixed with hydrogen and/or inert gas and/or other gases containing doping elements, (ii) electron beam evaporation, ion-assisted evaporation, magnetron sputtering, ion beam sputtering, or ion-assisted sputter deposition from a solid carbon or doped carbon target material, or (iii) combinations of (i) and (ii).

DLC films are well known in the art and have been recognized as potential coatings to enhance the abrasion resistance of various substrate materials, including recording media as discussed above. The DLC coatings possess excellent mechanical properties such as high hardness and low coefficient of friction, and exhibit excellent resistance to abrasion and chemical attack by nearly all known solvents, bases, and acids. However, it has been found that the DLC coatings will impart improved wear resistance to the substrate only if the adherence of the coating to the parent substrate is excellent.

The most obvious and common approach to coating a substrate is to apply the DLC coating directly onto a clean surface which is free of residue. However, this approach often results in a DLC coating which displays inadequate adhesion, and therefore, poor wear resistance. DLC coatings are typically under significant compressive stress, on the order of 0.5 to approximately 5 GPa. This stress greatly affects the ability of the coating to remain adherent to the substrate. Additionally, the surface of the substrate to be coated often contains alkali metals, oxides, and other contaminants which can inhibit bonding of the DLC coating. Therefore, novel and non-obvious methods are often required to produce a particular substrate with a highly adherent DLC coating which provides excellent abrasion resistance.

As noted in U.S. Pat. Nos. 5,545,454 and 5,424,106, Yamada, et al. suggest that DLC materials of unspecified composition could be used in the dielectric layers of the phase-change media structure. However, the DLC layers as discussed by Yamada, et al. would act as optical dielectric layers with their thickness predetermined by an optical performance criterion and calculations, and would not be intended to act as a tribologically and environmentally protective over-coat. Moreover, the phase-change media structures proposed in this and other prior art examples are not intended for use with near-field optic systems.

Protective non-doped DLC over-coats or hydrogenated DLC over-coats are widely used in the magnetic recording media industry. Exemplary of the prior art are Michihide, et al., EP 216 079 A1; Howard, U.S. Pat. No. 4,778,582; Meyerson, et al., U.S. Pat. No. 4,647,494; Japanese Laid Open Pat. Application (Kokai) No. 1-287819, Shinohara; Endo, et al. U.S. Pat. No. 4,774,130; Kurokawa. U.S. Pat. No. 4,717,622; and Nakamura, et al., U.S. Pat. No. 4,804,590. It has been widely established that protective DLC over-coatings produced by prior art means with magnetron sputtering, chemical vapor deposition, plasma chemical vapor deposition, plasma chemical vapor deposition, or plasma-injected chemical vapor deposition, can be no less than about 100 Å thick. The predominant production method for depositing DLC over-coats onto magnetic media is magnetron sputtering. Below this 100 Å threshold, protective performance of DLC coatings produced by magnetron sputtering on magnetic media disks becomes unacceptable based on conventional contact stop-start (CSS) tests of 20,000 to 50,000 cycles. Currently the magnetic media storage industry is looking for an alternative means to magnetron sputtering which can produce a DLC over-coat with satisfactory environmental and tribological performance at a thickness below 100 Å in order to further increase areal density.

An alternative method of forming a DLC over-coat is by direct ion beam deposition as described by Knapp, et al. in International Application under the PCT, WO 95/23878, published Sep. 8, 1995. It has been demonstrated that protective coatings produced by direct ion beam deposition provide superior environmental and tribological performance using established production methods for DLC over-coat thicknesses of about 50 Å on magnetic recording media. It is believed that such DLC coatings are superior to DLC coatings produced by other deposition techniques in that ion beam-deposited DLC has better morphology at such low film thicknesses. This can be attributed to the favorable surface energetics which are more readily selected and controlled by the direct ion beam deposition process.

Even with the successful performance of direct ion beam deposition of DLC on magnetic recording media, sliders and heads, it is not evident from the prior art how well ion beam deposited DLC films will perform on the surface of phase-change media. To the knowledge of the inventors, there is no prior art or teaching of protective DLC over-coats on phase-change media structures. Also, it is not obvious to one of ordinary knowledge and skill in the art based on the prior art how to adhere thin DLC coatings to either a phase-change recording layer or related dielectric surface layers so as to enable the use of near-field optical-head-sliders without damage to the phase-change media. A wide variety of materials have been used for adhesion-promotion of DLC over magnetic media and devices. Some of these adhesion-promoting materials include the following: amorphous silicon, silicon carbide, silicon nitride, silicon oxide, silicon oxy-nitride, and mixtures thereof (in some cases containing hydrogen), chrome, titanium, and germanium. It is not clear what material, if any will enhance adhesion of the DLC over-coats to standard dielectric surfaces, e.g. ZnS—SiO$_2$, or to phase-change recording layers. It is preferable to have a DLC over-coat that adheres well to the phase-change recording layer directly without the need for either adhesion or dielectric layers. Materials that have been suggested for such recording layers include, for example, alloys such as Ge—Sb—Te, In—Sb—Te, Sb—Te, Ge—Sb—Te—Pd, Ag—Sb—In—Te, Ge—Bi Sb—Te, Ge—Bi—Te, Ge—Sn—Te, Ge—Sb—Te—Se, Ge—Bi—Tc—Si, and Ge—Te—Sn—Au; with Ge$_2$Sb$_2$Te$_5$ shown to have specific application as a recording layer; see Yamada, et al., U.S. Pat. No. 5,545,454.

As discussed earlier, it is desirable to minimize the optical thickness of a DLC over-coat and related layers in order to achieve the highest possible areal densities. The thickness and index of refraction η of the DLC over-coat and all other additional sub-layers deposited on top of the phase-change optical recording layer determine the optical path length h between the near-field optic and the recording layer. The index of refraction for DLC and dielectrics like ZnS—SiO$_2$ can be as high as 2. Thus, their optical thickness is nearly double their physical thickness. Contemporary slider technology allows read/write devices to fly at about 250 Å over a conventional DLC over-coat on magnetic media without damage to the medium surface. It is reasonable to expect that a similar flight distance for a near-field read/write optical device on a slider is possible for DLC over-coats on a phase-change optical structure. Therefore, with an upper limit of h being about 1250 Å for viable areal densities in a phase-change optical medium, a DLC over-coat should be no more than 450 Å and preferably about 50 Å to allow for other thin, e.g., about 10 Å to about 100 Å, dielectric layers and adhesion-promoting interlayers if needed.

It would be desirable for such a DLC over-coat for phase-change media devices to have the following environmental protection and tribological properties:

(i) low friction and excellent wear-resistance performance to enable the slider and head to fly by means of the air bearing mechanism over the media;

(ii) high hardness (>8 GPa);

(iii) small overall thickness that is substantially less than 450 Å to enable high data storage densities with near-field laser optics;

(iv) excellent adhesion to the surface of the phase-change media structure with a thin interlayer or with no interlayer;

(v) stable material properties with respect to diffusion and interaction with the underlying phase-change media structure;

(vi) favorable wetting and interaction with topical lubricants if used; and (vii) excellent corrosion protection properties. Furthermore the process by which to produce such an over-coat should allow for high deposition rates (i.e. greater than 10 Å/sec) of the DLC layer and be integratable into manufactured platforms for mass production of near-field phase-change optical recording media devices.

SUMMARY OF THE INVENTION

The present invention provides a method for producing substantially new protective coatings on the surfaces of recording media for use with near-field optical head devices and the resulting product of such a method. The protective over-coat provides superior wear resistance and is particularly suited for applications where near-field optical devices are used to read and write information on the media. More particularly, the invention provides an ion beam DLC deposited outer layer to the surface of such media devices which is highly adherent and exhibits greatly improved resistance to wear, abrasion, corrosion and environmental durability. The invention also provides a low cost method for mass deposition of the wear resistant over-coats on near-field optical phase-change recording media.

In the method of the present invention, a typical optical recording structure, upon which a composite optical phase-change recording layer has been deposited by prior art means, is coated with an outer layer of DLC by ion beam deposition in an evacuated deposition vacuum chamber. After achieving the desired thickness of DLC, the ion beam deposition is terminated, the pressure in the vacuum chamber pressure is increased to atmospheric pressure and a coated optical recording medium having improved resistance to wear, abrasion and corrosion is recovered.

In this method, the resulting composite phase-change media structure has a protective DLC over-coating with a thickness of no greater than about 450 Å, preferably in the range of about 25 Å to about 450 Å. The wear resistant DLC coating protects the surface of the optical phase-change media from tribological damage by the mechanical slider apparatus holding the optical read/write devices. The DLC over-coat is deposited either directly on the optically active phase-change layer or on the surface of an additional thin dielectric layer. Depending on the selection of the underlying surface, the protective DLC over-coats may or may not include an adhesion-promoting interlayer. In all cases, the effective optical thickness between the optically active phase-change layer and the surface of the phase-change media with the protective DLC over-coats should be no more than about 1000 Å and preferably no more than about 250 Å. The structure allows very close spacing of near-field laser optic heads to the active phase-change layer within the media for high density information storage.

Silicon-doped DLC (Si-DLC) or germanium-doped DLC (Ge-DLC) can be used as the protective over-coat in the products of the present invention. Direct ion beam deposition from either hydrocarbon, silicon-containing or germanium-containing gases is preferred. A germanium interlayer formed by sputter deposition techniques may also be included to promote adhesion of the DLC, Si-DLC or Ge-DLC coating.

DETAILED DESCRIPTION OF THE INVENTION

The method of the present invention substantially reduces or eliminates the disadvantages and shortcomings associated with the techniques suggested in the prior art by providing:

(1) an improved optical recording media for use with a near-field optical head or a similar device (e.g., optical head slider), in which the media has improved lifetime, resistance to wear, and resistance to corrosion;

(2) a method for the manufacture of an optical recording media for use with a near-field optical head, in which the media has improved lifetime, resistance to wear, and resistance to corrosion;

(3) a method for the deposition onto the surface of an optical recording medium of an amorphous DLC overcoat facing the near-field optical head, in which the amorphous DLC coating has the properties of high adhesion to the media, impermeability to environmental elements such as water vapor and oxygen, high density, and extreme surface smoothness;

(4) a method for the deposition onto the surface of an optical recording medium of a thin amorphous DLC coating at layer thicknesses as small as 50 Å or less facing the near-field optical head, in which the thin amorphous DLC coating provides a protective surface for the media;

(5) a method for the deposition onto the surface of an optical recording medium of a protective amorphous DLC coating facing the near-field optical head, in which the layer thickness and uniformity of the protective amorphous DLC coating is reproducibly controlled to a high degree of accuracy; and (6) a method for the deposition onto the surface of an optical recording medium of a protective amorphous DLC coating facing the near-field optical head, in which the protective amorphous DLC coating is manufactured on optical disks with high throughput.

The ion beam deposited DLC coating protects the optical media from wear and corrosion damage during normal operation and significantly extends the lifetime of the media. Additionally, the method for manufacture of the ion beam deposited DLC coating substantially reduces or eliminates the disadvantages and shortcomings of other DLC coating methods.

It is not intended by the discussion of a particular optical recording media to limit the method of the present invention to any particular type of optical recording media.

It has been unexpectedly found that the ion beam deposition process for the DLC coatings of the present invention produced remarkable performance on a variety of optical recording media. The remarkable performance of ion beam DLC is the result of the combination of the critical features and attributes listed below. The method of the present invention is capable of:

(1) Overcoming the difficulties in obtaining an atomically clean surface by sputter-etching the optical media structure using an ion beam of controlled shape, current, and energy.

(2) Producing excellent adhesion of the protective ion beam deposited DLC layer by generating an atomically clean surface prior to the deposition of the coating.

(3) Producing coherent, highly dense ion beam deposited DLC coatings. This makes the coatings excellent barriers to water vapor and oxygen and prevents corrosion of the media. The excellent barrier properties of the thin ion beam deposited DLC coatings presumably result from the extremely high degree of ion bombardment during film growth, compared to prior art methods. It has been found that DLC coatings prepared by direct ion beam deposition from methane gas in accordance with the present invention have extremely low permeability to water vapor and oxygen. It was demonstrated that 250 Å-thick direct ion beam deposited DLC films having a hardness in the range of approximately 10–12 GPa decreased the oxygen permeability of polyethylene and polypropylene plastic film sheets by greater than 50 times. DLC coatings as thin as 50 Å provided similar results. The plastic sheet structures for this test were chosen especially for ease of determination of the permeability of the DLC coatings to oxygen and water vapor. The ion beam DLC of this invention has also been shown to satisfactorily prevent corrosion of magnetic disks when deposited at thicknesses as small as 50 Å. This corrosion resistance is superior to that of DLC produced by current production techniques (i.e. magnetron sputtering) in the magnetic media industry. In addition to their high density, the ion beam deposited DLC coatings of the present invention are also exceedingly smooth, which produces a surface with high resistance to wear.

(4) Producing coherent, dense ion beam DLC coatings having thickness of 50 Å or less and providing optical media with excellent wear protection. This result is also presumably due to the extremely high degree of ion bombardment during film growth, compared to prior art methods. Ultra-low thickness protective layers are critically important for the newest technology of ultra-high density near-field optical recording media, in which the distance between the optical head slider and the media surface is as small as 250 Å or less.

(5) Producing a coating in which its properties do not change with layer thickness as is found for the prior art RF plasma deposition processes. This attribute is achieved because the coating deposition step is preferably conducted with a charge neutralized ion beam. For optical media which contain electrically conducting and electrically insulating materials, all portions can be coated with the same high-quality DLC coating. In contrast, plasma deposited DLC coatings on different locations of the same structure will have different properties depending upon whether the area being coated is an electrical conductor or an electrical insulator, and depending upon electrical connections between the structures and the vacuum chamber. The lack of substrate geometry constraints of the present invention is in sharp contrast to the plasma deposition methods of the prior art.

(6) Coating optical media with unsophisticated fixturing. Because the ion beam DLC deposition process is mostly unaffected by optical media shape or configuration or electrical conductivity, the ion beam process of the present invention can be used to apply a DLC coating to the optical media structure without significant restrictions on the fixturing technique.

(7) Obtaining minimal batch-to-batch variation in the properties of the DLC coatings. This is the case because process parameters such as ion energy, ion current density, gas flow rate, and deposition chamber pressure are largely de-coupled in the ion beam deposition method of the present invention, and because each of these process parameters can be accurately controlled and reproduced to a high degree of certainty, often to within 1%.

(8) Producing high part-to-part thickness uniformity, e.g. a variation of less than 2% can be easily achieved. This is the case because of the compatibility of the method of the present invention with commercially available substrate holders, both stationary and incorporating rotation and/or planetary motion.

(9) Being readily scaled-up to accommodate mass production through use of large and/or high deposition rate ion beam sources. For example, commercially available 38 cm ion beam sources have been used to deposit DLC coatings simultaneously over four 18-inch diameter platens with a thickness variation across all parts of less than +/−2%. Similar ion beam sources can be used to practice the process of the present invention. Plasma deposition systems for DLC coatings are not presently commercially available on this scale.

Figure 1:
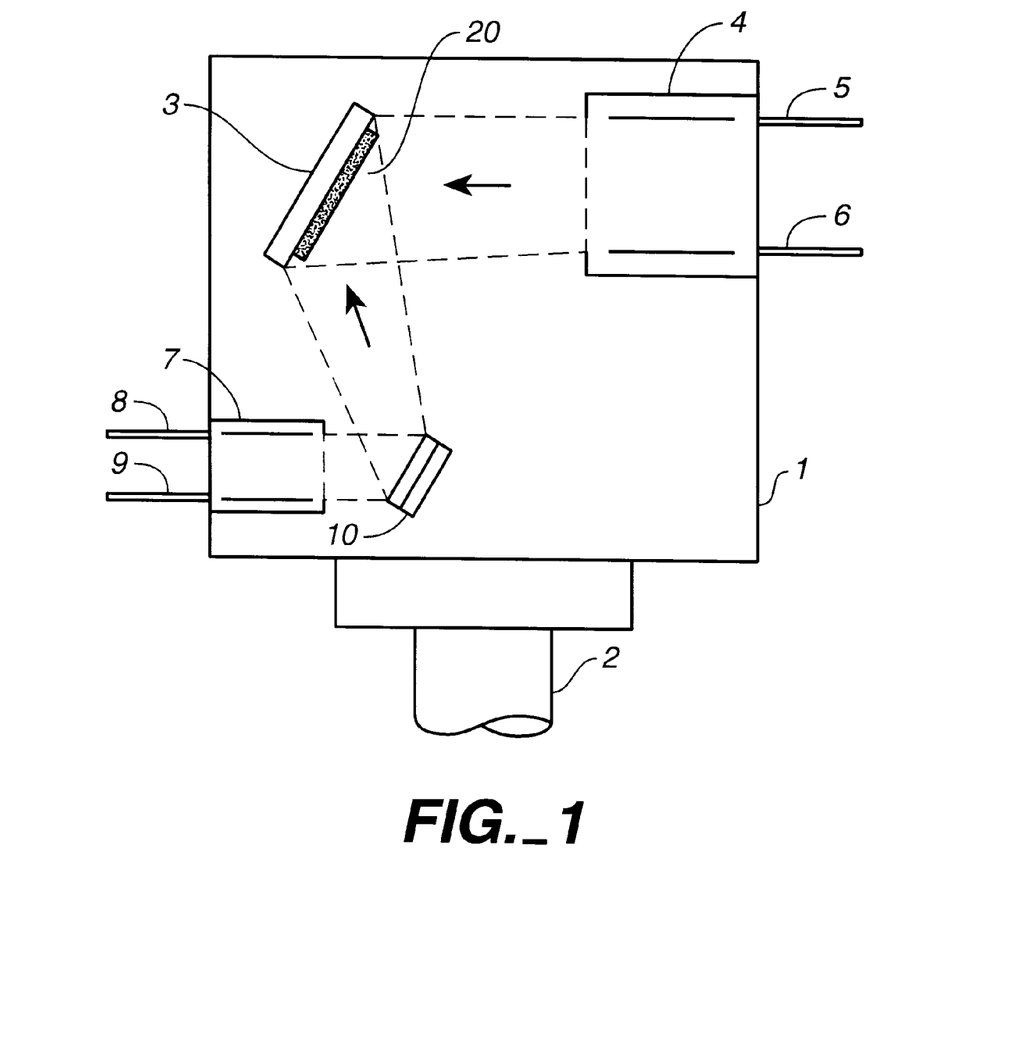
FIG. 1 is an illustration of the ion beam process used to deposit the DLC over-coat to an optical phase-change media structure.

The apparatus for carrying out one embodiment of the present invention is illustrated schematically in FIG. 1. The coating process is carried out inside a high vacuum chamber 1 which is fabricated according to techniques known in the art. Vacuum chamber 1 is evacuated into the high vacuum region by first pumping with a rough vacuum pump (not shown) and then by a high vacuum pump 2. Pump 2 can be a diffusion pump, turbomolecular pump, cryogenic pump ("cryopump"), or other high vacuum pumps known in the art. The use of cryopumps with carbon adsorbents is somewhat less advantageous than other high vacuum pumps because those cryopumps have a low capacity for hydrogen which is generated by the ion beam sources used in the present invention for the deposition of DLC. The low capacity for hydrogen results in the need to frequently regenerate the adsorbent in the cryopumps.

It is understood that the process of the present invention can be carried out in a variety of commercially available coating systems designed for the manufacture of optical and magnetic recording media, provided that such systems are retrofit with ion beam deposition technology. Such coating systems include in-line and single disk coaters in which a batch of substrates or a single substrate, respectively, enter through a load-lock, sequentially pass through several depositions/process stations, often separated by valves, and then exit through the load-lock. These systems are available for coating one or both sides of a substrate.

In the apparatus of FIG. 1, optical media structure to be coated are mounted on substrate or structure holder 3, which may incorporate tilt, simple rotation, planetary motion, or combinations thereof. Media holder 3 can be in the vertical or horizontal orientation, or at any angle in between. Vertical orientation is preferred to minimize particulate contamination of the structures, but if special precautions such as low turbulence vacuum pumping and careful chamber maintenance are practiced, the structures can be mounted in the horizontal position and held in place by gravity. This horizontal mounting is advantageous from the point of view of easy fixturing for gravity held media. This horizontal geometry can be most easily visualized by rotating the illustration in FIG. 1 by 90 degrees.

Prior to ion beam deposition of DLC, surface contamination on the optical media surface are removed by ion beam sputter-etching with an energetic ion beam generated in ion beam source 4. Ion source 4 is provided with inlet 5 for introduction of inert gases, such as argon, krypton, and xenon, for the sputter-etching. Ion beam source 4 can be any ion source known in the prior art, including Kaufman-type direct current discharge ion sources, radio frequency or microwave frequency plasma discharge ion sources, each having one, two, or three grids, or gridless ion sources such as the End Hall ion source of U.S. Pat. No. 4,862,032, or a hall accelerator such as that described by Fedoseev, et al. in Diamond and Related Materials Vol. 4, pages 314–317 (1995). The ion source beam is charge neutralized by introduction of electrons into the beam using a neutralizer (not shown), which may be a thermionic filament, plasma bridge, hollow cathode, or other types known in the prior art. If a deposition system is used in which the phase-change structure and the DLC are both deposited sequentially in the same system without breaking vacuum, the surface of the optical disk structure may not be contaminated and so not require sputter etching to remove contamination, Ion source 4 is also used for DLC deposition. Inlet 6 is for the introduction of methane, acetylene, hydrogen and similar gas for the deposition of non-doped hydrogenated DLC, and silicon-containing and Ge-containing gases including but not limited to silane, methylsilane, dimethylsilane, trimethylsilane, tetramethylsilane, germane, tetramethylgermane for deposition of Si-DLC and Ge-DLC. Nitrogen can be added to form N-doped DLC. Mixtures of multiple doping gases and hydrocarbon gases can used also. As disclosed by Mirtich, et al. in U.S. Pat. No. 4,490,229, an additional ion source (not shown) can be used to co-bombard the structures during DLC deposition to alter the film properties.

In this embodiment of the present invention, an additional ion beam source 7, is also provided for ion beam sputter-deposition of interlayer materials onto the structures. Ion source 7 can be any type of ion source listed for ion source 4 above. Ion beam source 7 is provided with inlets for operation on inert gases 8, such as argon, krypton, and xenon, and for reactive gases 9, such as nitrogen and oxygen. The ion beam from source 7 is directed onto a sputtering target 10. The target can be pure silicon or germanium, or compounds of these elements. Interlayers of silicon and germanium compounds can also be deposited by sputtering in a reactive atmosphere. The method for the deposition of interlayers is not limited to ion beam deposition. Other vacuum deposition methods such as magnetron sputtering, RF plasma deposition, ECR plasma deposition, plasma arc, laser ablation, and evaporation can be used.

In the method of the present invention, the optical recording media structure is inserted into a vacuum chamber, and the air in said chamber is evacuated. Typically, the vacuum chamber is evacuated to a pressure of about $1 \times 10^{-5}$ Torr or less to ensure removal of water vapor and other contaminants from the vacuum system. However, the required level of vacuum which must be attained prior to initiating the next step must be determined by experimentation. The exact level of vacuum is dependent upon the nature of the structure material, the sputter-etching rate, the constituents present in the vacuum chamber residual gas, and the details of any adhesion-promoting interlayer.

In the next sequential step of the method of the present invention, the surface of the optical structure may be bombarded with energetic gas ions to assist in the removal of residual contaminants, e.g. any residual hydrocarbons, surface oxides and other contaminants, and to achieve good adhesion of the interlayer or the DLC over-coat if no interlayer is used. This sputter-etching of the structure surface is required to achieve high adhesion of interlayer. The sputter-etching can be carried out with inert gases such as argon, krypton, and xenon. Additionally, hydrogen may be added to the ion beam to assist in activation of the surface. Typically, in order to achieve efficient and rapid ion sputter-etching, the ion beam energy is greater than 20 eV. Ion energies as high as 2000 eV can be used, but ion beam energies in the range of about 20 to about 500 eV result in the least amount of atomic scale damage to the phase-change optical media structure.

Immediately after the optical media structure surface has been sputter-etched, an interlayer material may be deposited. In the method of the present invention, it has been unexpectedly found that germanium performs remarkably well as an adhesion-promoting interlayer for non-doped ion beam DLC on phase-change optical media structures having a surface dielectric layer. It is currently believed that reaction of the germanium atoms in the interlayer material with both the dielectric material and the carbon atoms in the non-doped DLC layer is essential for the DLC coating to exhibit excellent adhesion. Further evidence that germanium is unexpectedly important for adhesion is that non-doped ion beam DLC adheres moderately well without an interlayer to phase-change optical media structures having a surface phase-change material layer containing germanium. Furthermore, germanium-doped DLC is expected to adhere directly to the dielectric layer without the need for a germanium interlayer. This is based on the finding, disclosed in the co-pending application Ser. No. 08/707,188, filed Sep. 3, 1996 (Docket No. 6051/53132), that Si-doped DLC adheres directly to structures such as magnetic transducers which would otherwise require a silicon interlayer in order for a non-doped DLC coating to adhere.

The thickness of the germanium interlayer can be in the range of about 5 Å to about 100 Å in thickness. However, in order to provide the minimum spacing between the near-field optical head slider and the phase-change material of the optical media structure, Ge layer thicknesses at the low end of this range, e.g. about 5 Å to about 50 Å, are preferred.

The germanium interlayer can be deposited by a variety of processes, including magnetron sputtering, plasma deposition, direct ion beam deposition, or ion beam sputter deposition, including magnetron sputtering, plasma deposition by RF, microwave means, direct ion beam deposition or ion beam sputter deposition. In all of these processes it is possible to enhance the growth and properties of the interlayer by applying an energetic means to the phase-change media substrate such as thermal energy or an RF electrical bias. The germanium interlayer is preferably deposited by either magnetron sputtering or by ion beam sputter deposition.

Following completion of the deposition of the germanium interlayer to the desired thickness, a DLC top layer is deposited by ion beam deposition. It is important to minimize the time between completion of the interlayer deposition, and the start of the deposition of the DLC layer. Deposition of the DLC layer immediately after completion of the interlayer deposition step minimizes the possibility for re-contamination of the interlayer surface with vacuum chamber residual gases or other contaminants. The thickness of the protective ion beam deposited DLC coating is constrained to small dimensions since the coating thickness adds directly to the spacing between the near-field optical head slider and the phase-change material of the optical media structure. Depending on the design and operation of the near-field head, the desired DLC coating thickness is typically in the range of about 25 Å to about 450 Å, but preferably no greater than 100 Å.

Several ion beam deposition methods may be used for the formation of the DLC coatings of the present invention, including direct ion beam deposition, direct ion beam deposition with ion assist, i.e. "direct dual ion beam deposition", ion beam sputter deposition from a carbon target, ion beam sputter deposition with ion assist, i.e. "dual ion beam sputter deposition," and deposition using an ion acceleration optics ion source. The ion beam sputter deposition methods offer excellent control, uniformity, and flexibility of substrate geometry, but the deposition rate is slower than that of the direct ion beam deposition process. Other methods include magnetron sputtering of a carbon target with an Ar and hydrocarbon gas mixture. This method is known to produce less coherent films at thicknesses below about 100 Å, leading to premature failure on magnetic storage media. Filtered carbon cathodic arc ion sources and laser ablation (from a solid carbon target) ion sources can also be used as ion sources for generation of the carbon deposition flux for the DLC coatings of the present invention. In these methods, it is essential to perform some filtering of the beam to remove particles which degrade the coating. These methods can produce extremely hard DLC coatings with very low hydrogen content. However, the coating stress level is high, and extreme care in substrate chemical cleaning, ion beam pre-cleaning, and interlayer deposition must be taken to obtain excellent coating adhesion. These methods produce doped DLC when process gases or targets contain elements other than carbon and hydrogen. In all of these DLC deposition processes it is possible to enhance the growth and properties of the over-coat by applying an energetic means to the phase-change media substrate such as thermal energy or RF electrical bias.

For sake of process simplicity, rapid deposition, and ease of scale-up to mass production, direct ion beam deposition of non-doped DLC from a hydrocarbon gas source is the most preferred deposition process for this invention. Methane as the hydrocarbon source gas is preferred, but other hydrocarbon gases, such as acetylene, butane, hexane, and benzene can be used as well. Inert gases and hydrogen may be introduced into the ion source plasma to modify the DLC film properties. The ion energy used in the DLC deposition process may be in the range of approximately 20 eV to approximately 1000 eV. Ion energies in the range of about 40 eV to about 500 eV are most preferred to produce the hardest, most wear resistant coatings. Excellent wear resistance and low permeability have been demonstrated by DLC coatings having a hardness in the range of about 10 to about 22 GPa using direct ion beam deposition. In addition to the ion beam for direct deposition, an ion assist beam, as in U.S. Pat. No. 4,490,229, can be utilized but is not required.

Once the chosen thickness of the DLC layer has been achieved, the deposition process on the recording media structures is terminated, the vacuum chamber pressure is increased to atmospheric pressure, and the coated structures are removed from the vacuum chamber.

FIGS. 1 and 2A through 2D illustrate various combinations of phase-change optical media structures 20 with a protective DLC over-coat that may be produced by the method of this invention. These structures are illustrative only and are not meant to limit the scope of the claims in any way.

Figure 2A:
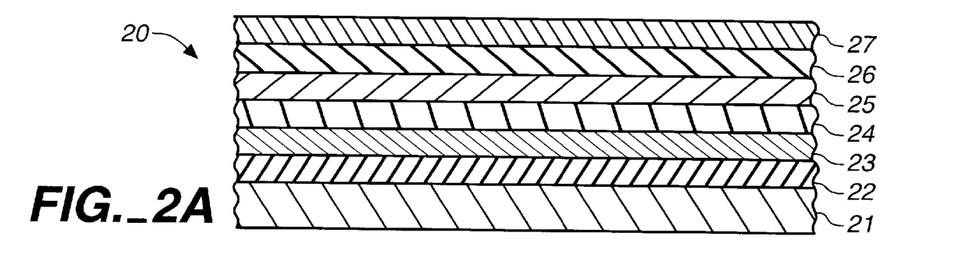
FIGS. 2A, 2B, 2C, and 2D illustrate typical phase-change media structures for single-sided data storage with operation in reflective mode.

FIG. 2A shows a cross section of one variation of a phase-change optical media 20. The media structure begins with a relatively thick substrate base 21 made of either metal such as aluminum, or plastic, such as polycarbonate or glass or other known recording media substrate. An effective reflective layer or group of layers 22 is deposited on top of the substrate along with a dielectric protection layer or group of layers 23. The phase-change recording layer 24 is then formed on top of the layer(s) 23. Layers 21, 22, 23 and 24 form the main structure of the phase-change optical recording medium to be operated in reflection mode with near-field optics. The media structure of FIG. 2A has an additional dielectric layer 25 over recording layer 24. The final protective over-coat is comprised of an adhesion-promoting interlayer 26 and a non-doped DLC, Si-DLC or Ge-DLC over-coat 27. This media structure, which incorporates dielectric layer 25, may be preferred when material interdiffusion or thermal expansion problems between the phase-change recording layer 24 and the protective over-coat layers 26 and 27 are of concern, or when dielectric layer 25 is desired to mitigate optical problems in the media structure related to transmission, reflection and absorption.

Figure 2B:
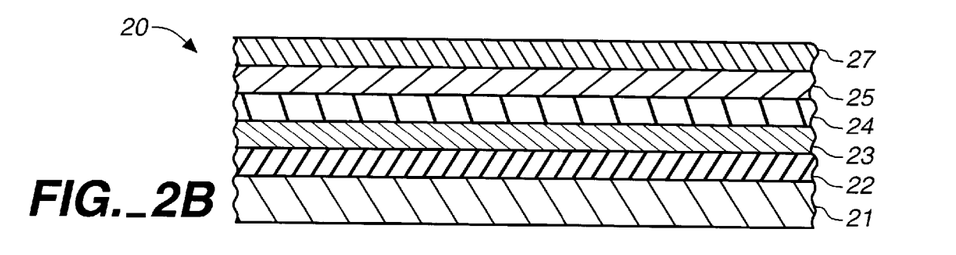

Other phase-change optical media structures with a DLC over-coat may be used to further decrease the distance h between the phase-change recording layer and slider head and thereby increase areal density. FIG. 2B illustrates another variation of the media structure in which the protective DLC over-coat in which the adhesion-promoting interlayer 26 is not included. This may be permissible when a Ge-DLC over-coat, for example, is deposited directly on a ZnS—SiO$_2$ dielectric surface.

Figure 2C:
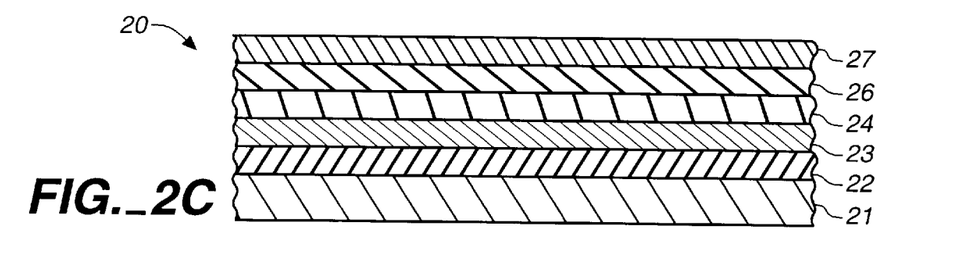

FIG. 2C shows another possible structure in which the dielectric layer 25 is removed altogether. This may be allowed when the conventional thermal, optical and material functions of this dielectric layer are not required.

Figure 2D:
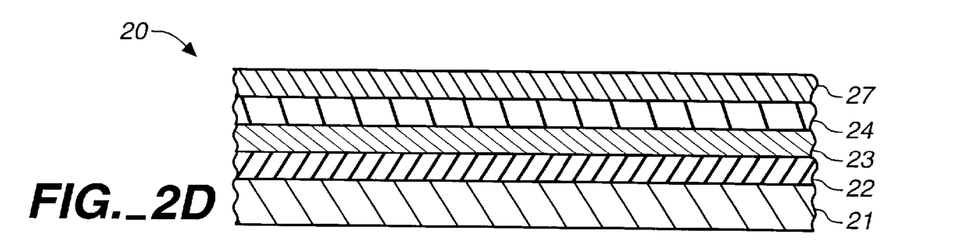

Finally FIG. 2D shows a structure wherein the dielectric layer 25 and adhesion-promotion layer 26 are both removed to further decrease the effective value of h.

It is understood that the media structures illustrated in FIGS. 2A through 2D may be applied to both sides of substrate 21, such as a disk substrate, so as to produce a dual-sided phase-change optical recording media.

Figure 3A:
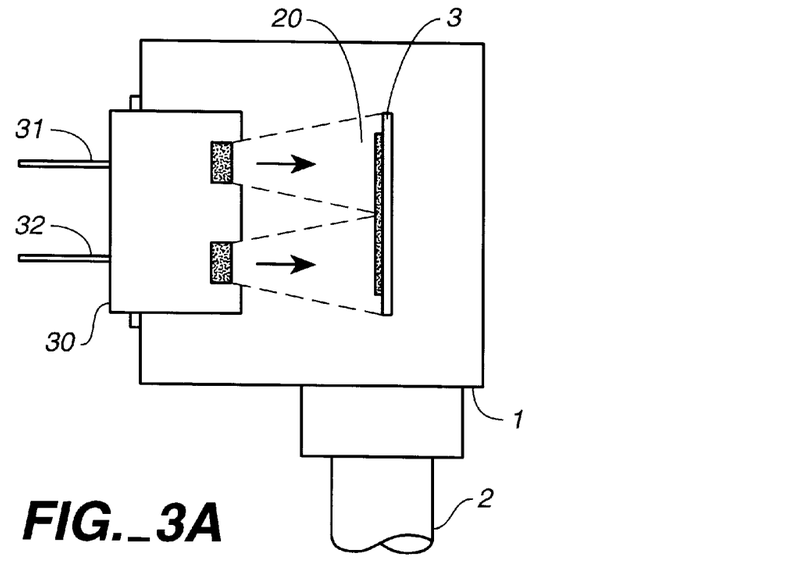
FIGS. 3A and 3B illustrate deposition of the DLC over-coat applied by a Hall-Current variety ion source to one side and to both sides of an optical phase-change media structure.

While FIG. 1 illustrates direct ion beam deposition of DLC over-coats by means of a gridded ion source, it is possible to deposit similar DLC coatings from a gridless ion source. FIG. 3A illustrates the use of a gridless Hall-Current ion source 30 (similar to the "Hall-Accelerator" described by Fedoseev, et al. and the "End-Hall" ion source disclosed in U.S. Pat. No. 4,862,032) for high rate deposition of DLC coatings. As with gridded ion sources, inert and reactive gases may be introduced into the ion source by means of one or more gas channels (31 and 32). The substrate may be mounted on media holder 3 which may be held in a static position or be dynamically adjusted during deposition in order to achieve a desired coating uniformity. It has been demonstrated that such gridless ion sources can be used to deposit DLC coatings from a mixture of argon, hydrogen and hydrocarbon gases with rates as high as 30 Å/sec and hardnesses in the range of 3 to 22 GPa. These rates of DLC growth supersede those that can be obtained typically with conventional gridded ion sources by three to ten times. Such high rates are desired for mass production of DLC on phase-change optical disk recording media. Moreover, gridless ion source are preferable in production in that they generally have fewer maintenance problems when compared to gridded ion sources. It should be noted that doped DLC coatings may be produced by either gridded or gridless ion sources as disclosed by Knapp, et al. in U.S. Pat. No. 5,508,368 and in co-pending application Ser. No. 08/707, 188 (Docket No. 6051/53132).

Also, in the configurations shown in FIG. 1 and FIG. 3A it is possible to further enhance the growth and properties of the deposited interlayer materials or DLC coating by radiating the substrate with thermal energy, applying an RF bias to holder 3, or by using a secondary ion bombardment means during or intermittently through the deposition process.

Figure 3B:
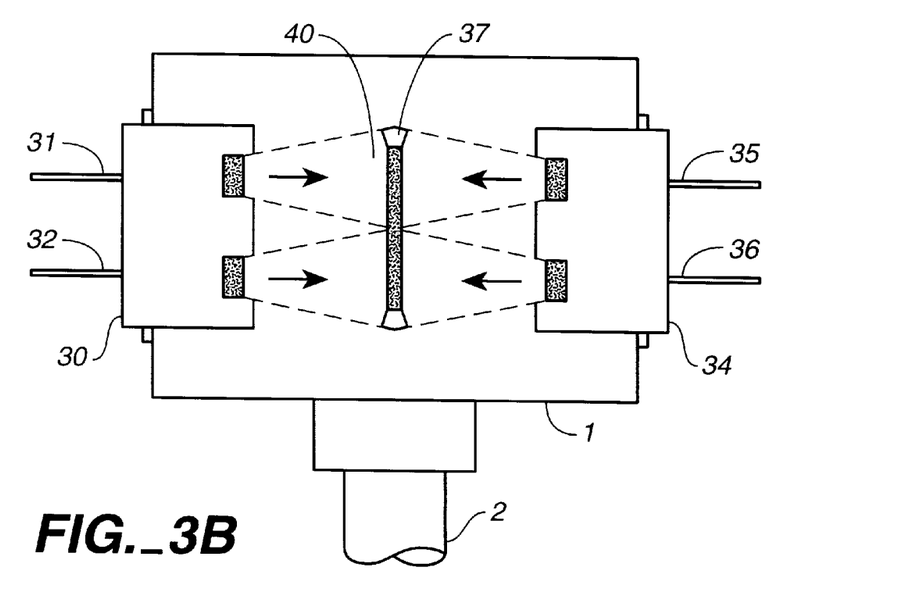

As illustrated in FIG. 3B, it is possible to carry out the process of the given invention on both sides of a recording media structure. In this configuration, two gridless, Hall-Current-type ion sources 30 and 34 are used to deposit onto two separate sides of a media substrate suspended in holder 37 which permits dual-sided deposition to produce dual-sided phase-change optical recording media 40.

EXAMPLES

The examples and discussion which follow further illustrate the superior performance of the coated products of the method of this invention. The examples are for illustrative purposes and are not meant to limit the scope of the claims in any way.

Example 1

The surface of a phase-change optical media structure having a 95 mm diameter glass substrate and coated with Ge—Te—Sb phase-change material alloy was coated with DLC by the following ion beam method. The optical media structure was mounted onto a rotary stage, and the vacuum chamber was evacuated to a pressure of less than $5.0 \times 10^{-6}$ Torr. The media was then sputter-etched using an argon ion beam from an 11 cm Kaufman-type ion source at an energy of 200 eV with a beam current of 50 mA for 5 seconds. The etch rate under these conditions was about 5 Å/second. After this sputter-etching step, a 150 Å thick DLC layer was deposited by direct ion beam deposition using the 11 cm Kaufman-type ion source, operated with methane gas at a beam energy of 75 eV and a beam current of 50 mA for 5.5 minutes. Using a commercial spin stand, the ability of an optical head slider to fly a various heights above the spinning coating media was tested. The results showed that an optical head slider could be flown at the desired fly height of less than or about 1 $\mu$m (=254 Å). Optical head sliders could not be flown on uncoated optical media at such low fly heights without damaging the optical media. In this example, the sum of the fly height and the 150 Å DLC coating thickness are sufficiently low to permit near-field recording.

Example 2

In order to determine whether interlayer materials could enhance the adhesion of the DLC to phase-change media structures, a variety of well known adhesion layer materials were tried as interlayers between optical phase-change media structures and the DLC. The four interlayer materials were silicon, silicon dioxide, silicon nitride, and silicon carbide. Media structures were also coated with DLC without an adhesion layer. Two different phase-change optical media structures were coated: one with a surface layer of Ge—Te—Sb phase-change material and a second with a surface layer of ZnS—SiO$_2$ on the Ge—Te—Sb phase-change material. The interlayer materials and the DLC were deposited by the following method. One of the two optical media structures was mounted onto a rotary stage, and the vacuum chamber was evacuated to a pressure of less than $5.0 \times 10^{-6}$ Torr. The media was then sputter-etched using an argon ion beam from an 11 cm Kaufman-type ion source at an energy of 200 eV with a beam current of 50 mA for 5 seconds. After this sputter-etching step, ion beam sputter deposition was used to deposit a 25 Å thick interlayer of one of the four interlayer materials. After deposition of the interlayer, a 350 Å thick DLC layer was deposited by direct ion beam deposition using the 11 cm Kaufman-type ion source, operated at a beam energy of 75 eV and a beam current of 50 mA. The 350 Å thickness value was chosen for two main reasons: one, the thick films are easy to see by eye allowing one to visually determine if the coating is adhering or delaminating; two, DLC films have compressive stress such that thicker films will naturally test the adhesion of DLC by applying more force for delamination at the interface between the coating and the substrate.

For testing of DLC adhesion on phase-change optical media structures, three adhesion tests have been applied: a tape pull test, a thermal shock test, and an alcohol rub test. The tape test involved peeling off adhesive tape that had been pressed onto the coating. This test was passed if no coating was removed. The thermal shock test involved transferring the coated media back and forth between an ice water bath and a boiling water bath for five two minute cycles, one minute in each of the two bathes. This test was passed if no coating was removed. The alcohol rub test involved rubbing the coated part with a clean room wipe moistened with isopropyl alcohol. The test was passed if no coating was removed. In various adhesion experiments, it was found that the alcohol rub test was the most severe test of adhesion and was easy to perform. Furthermore a qualitative measure of an adhesion could be determined by how aggressive the rubbing required to cause adhesion failure.

The alcohol rub test was applied to the coated media of this example. For DLC coatings on any of the four interlayer materials on the optical media with the surface layer of Ge—Te—Sb, the DLC rubbed off easily. For DLC coating without adhesion layers on media with a surface layer of Ge—Te—Sb, the DLC rubbed off but with some difficulty. Thus, the well known adhesion layer materials were apparently detrimental for adhesion of non-doped DLC to Ge—Te—Sb phase-change material, presumably because the interlayer materials did not adhere as well to the Ge—Te—Sb as did non-doped DLC itself. For DLC deposited on any of the four interlayer materials on the optical media with the surface layer of $ZnS—SiO_2$, the DLC rubbed off with the most difficulty. For the DLC coating without an interlayer on the optical media with the surface layer of $ZnS—SiO_2$, the DLC coating wiped off easily. Thus the interlayers helped the DLC to adhere to $ZnS—SiO_2$.

Example 3

In an attempt to find an adhesion layer that produced better adhesion with nondoped DLC to optical media with a surface layer of $ZnS—SiO_2$, a germanium interlayer was tried. The deposition method of Example 3 was used to deposit a 350 Å non-doped DLC layer on a 25 Å germanium interlayer on the $ZnS—SiO_2$ surface layer of a phase-change optical media structure. The alcohol rub adhesion test of Example 2 was applied to the coating and found to pass the test even with vigorous rubbing, revealing unexpectedly that Ge was a good interlayer for promoting adhesion of non-doped DLC to phase-change optical media structures with surface layers of $ZnS—SiO_2$. Moreover, Ge proved to be a superior adhesion-promoting interlayer over all other interlayer materials discussed in Example 2.

Example 4

With the unexpectedly good adhesion found for the germanium layer in foregoing examples, experiments were performed to determine what the minimum thickness of DLC with a germanium interlayer is required to provide the capability of flying a near-field optical head slider at or below 1 µm. The deposition method of Example 2 was used to deposit 250, 200, 175, 150, 125, 100, 75, 50 and 25 Å of non-doped DLC layer on a 25 Å germanium interlayer on the $ZnS—SiO_2$ surface layer of a phase-change optical media structure with a 95 mm diameter glass disk substrate. Using a commercial spin stand, the ability of an optical head slider to fly at various heights above the spinning coating media was tested. Very unexpectedly, the near-field optical head slider could be flown at about 1 µm or less on all the disks, revealing that Ge is an excellent interlayer for depositing non-doped DLC on phase-change optical media structures with a surface layer of $ZnS—SiO_2$.

Without departing from the spirit and scope of this invention, one of ordinary skill in the art can make various changes and modifications to the invention to adapt it to various usages and conditions. As such, these changes and modifications are properly, equitably, and intended to be, within the full range of equivalents of the following claims.

What is claimed is:

1. A method for producing protective coatings on the surface of recording media for use with near-field optical head devices comprising the sequential steps of:
   (a) depositing a composite optical phase-change recording layer onto a substrate;
   (b) depositing a dielectric interlayer onto said composite optical phase-change recording layer;
   (c) depositing an adhesion-promoting interlayer comprising germanium onto said dielectric interlayer in an evacuated deposition vacuum chamber;
   (d) ion beam depositing an outer layer of DLC to a thickness of no greater than about 450 Å onto said adhesion-promoting interlayer in said evacuated deposition vacuum chamber such that the combined thicknesses of said DLC outer layer, the combined thicknesses of said dielectric interlayer and said adhesion-promoting interlayer are no greater than 500 Å;
   (e) increasing the vacuum chamber pressure to atmospheric pressure; and
   (f) recovering coated optical phase-change recording media having improved resistance to wear, abrasion and corrosion.

2. The method of claim 1 wherein said adhesion-promoting interlayer contains germanium having a thickness in the range of about 5 Å to about 100 Å.

3. The method of claim 1 wherein said adhesion-promoting interlayer is deposited by ion beam sputter deposition.

4. The method of claim 1 wherein said adhesion-promoting interlayer is deposited by direct ion beam deposition.

5. The method of claim 4 wherein said direct ion beam deposition uses an ion acceleration optics ion source.

6. The method of claim 5 wherein said direct ion beam deposition uses an electrostatic gridded ion source.

7. The method of claim 4 wherein said direct ion beam deposition uses a gridless Hall-Current ion source.

8. The method of claim 1 wherein said adhesion-promoting interlayer is deposited by direct deposition using an RF or microwave driven plasma deposition means.

9. The method of claim 1 wherein said adhesion-promoting interlayer is deposited by magnetron sputter deposition.

10. The method of claim 1 wherein said adhesion-promoting interlayer is deposited in the presence of an energetic means applied to said structure to enhance growth and physical properties of said interlayer.

11. The method of claim 10 wherein said energetic means includes thermal radiation and heating of said structure.

12. The method of claim 10 wherein said energetic means includes an ion beam bombarding the surface of said structure.

13. The method of claim 10 wherein said energetic means includes an RF electrical bias applied to said structure.

14. The method of claim 1 wherein said outer layer is deposited by direct ion beam sputter deposition of a target containing a material selected from the group consisting of carbon, a mixture of carbon and silicon, and a mixture of carbon and germanium.

15. The method of claim 1 wherein said DLC outer layer is deposited by direct ion beam deposition by an ion source means.

16. The method of claim 15 wherein said DLC outer layer is deposited from a hydrocarbon gas.

17. The method of claim 15 wherein said DLC outer layer is deposited from a gas mixture containing in part a silicon-containing gas.

18. The method of claim 17 wherein said gas mixture includes a gas selected from the group of silane, disilane, tetramethylsilane, and dielthylsilane.

19. The method of claim 15 wherein said DLC outer layer is deposited from a gas mixture containing in part a germanium-containing gas.

20. The method of claim 19 wherein said gas mixture includes a gas selected from the group of germane and tetramethylgermane.

21. The method of claim 15 wherein said direct ion source uses ion acceleration optics ion source.

22. The method of claim 21 wherein said direct ion beam deposition uses an electrostatic gridded ion source.

23. The method of claim 15 wherein said direct ion beam deposition uses a gridless Hall-Current ion source.

24. The method of claim 1 wherein said DLC outer layer is deposited in the presence of an energetic means applied to said structure to enhance growth and physical properties of said interlayer.

25. The method of claim 24 wherein said energetic means includes thermal radiation and heating of said structure.

26. The method of claim 24 wherein said energetic means includes an ion beam bombarding the surface of said structure.

27. The method of claim 24 wherein said energetic means includes an RF electrical bias applied to said structure.

28. The product of claim 1 wherein said adhesion-promoting interlayer is in the range of about 10 Å to about 100 Å.

29. The product of claim 1 wherein said dielectric interlayer is in the range of about 10 Å to about 100 Å.

30. The product of claim 1 wherein said DLC outer layer is in the range of about 25 Å to about 450 Å.

31. The product of claim 28 wherein said dielectric interlayer is in the range of about 10 Å to about 100 Å.

32. The product of claim 31 wherein said DLC outer layer is in the range of about 25 Å to about 450 Å.

33. The method of claim 1 wherein said dielectric interlayer is $ZnS$—$SiO_2$.

* * * * *